(12) United States Patent
Lintymer

(10) Patent No.: US 12,358,183 B2
(45) Date of Patent: Jul. 15, 2025

(54) METHOD FOR PRODUCING A CERAMIC WITH A MOTHER-OF-PEARL EFFECT, PARTICULARLY FOR WATCHMAKING

(71) Applicant: Comadur SA, Le Locle (CH)

(72) Inventor: Jan Lintymer, Mamirolle (FR)

(73) Assignee: Comadur SA, Le Locle (CH)

( * ) Notice: Subject to any disclaimer, the term of this patent is extended or adjusted under 35 U.S.C. 154(b) by 274 days.

(21) Appl. No.: 17/658,735

(22) Filed: Apr. 11, 2022

(65) Prior Publication Data

US 2022/0339816 A1 Oct. 27, 2022

(30) Foreign Application Priority Data

Apr. 21, 2021 (EP) .................... 21169680

(51) Int. Cl.
*B28B 11/04* (2006.01)
*B28B 11/00* (2006.01)
*C04B 41/85* (2006.01)
*C04B 41/91* (2006.01)
*C23C 14/02* (2006.01)
*C23C 14/06* (2006.01)
*G04B 19/18* (2006.01)
*G04D 3/00* (2006.01)

(52) U.S. Cl.
CPC ............ *B28B 11/04* (2013.01); *B28B 11/001* (2013.01); *C04B 41/85* (2013.01); *C04B 41/91* (2013.01); *C23C 14/02* (2013.01); *C23C 14/0676* (2013.01); *G04B 19/18* (2013.01); *G04D 3/0069* (2013.01); *G04D 3/0074* (2013.01); *C04B 2235/945* (2013.01); *C04B 2235/9661* (2013.01)

(58) Field of Classification Search
None
See application file for complete search history.

(56) References Cited

U.S. PATENT DOCUMENTS

| 6,270,907 | B1 | 8/2001 | Michel | |
|---|---|---|---|---|
| 2002/0022157 | A1 | 2/2002 | Michel | |
| 2015/0307405 | A1* | 10/2015 | Huguet | C04B 41/85 |
| | | | | 264/603 |
| 2018/0181071 | A1* | 6/2018 | Spassov | C23C 14/0676 |

(Continued)

FOREIGN PATENT DOCUMENTS

| CH | 703 155 B1 | 11/2011 |
|---|---|---|
| CH | 711 958 A2 | 6/2017 |
| CN | 1234537 A | 11/1999 |

(Continued)

OTHER PUBLICATIONS

Mohamed et al.; Effect of Annealing on Properties of Decorative Zirconium Oxynitride Films; The European Physical Journal Applied Physics; 2015; 69:30301.*

(Continued)

*Primary Examiner* — Michael P. Rodriguez
(74) *Attorney, Agent, or Firm* — Oblon, McClelland, Maier & Neustadt, L.L.P.

(57) ABSTRACT

A method may produce a ceramic part with a mother-of-pearl effect, in particular for watchmaking. Such methods may include: forming a ceramic body; depositing a layer of an oxy-nitride component of the OxNy type on at least a portion of the ceramic body; and oxidizing at least a portion of the oxy-nitride layer, preferably by heating.

17 Claims, 2 Drawing Sheets

(56) References Cited

U.S. PATENT DOCUMENTS

2020/0157009 A1  5/2020  Porret et al.

FOREIGN PATENT DOCUMENTS

| CN | 108239747 A | | 7/2018 |
|---|---|---|---|
| CN | 109650905 A | | 4/2019 |
| CN | 110546120 A | | 12/2019 |
| EP | 3 339 983 A1 | | 6/2018 |
| JP | 58-81977 A | | 5/1983 |
| JP | S5881977 | * | 5/1983 |
| JP | 3-207853 A | | 9/1991 |
| JP | 2020-55742 A | | 4/2020 |
| JP | 2020-84324 A | | 6/2020 |

OTHER PUBLICATIONS

Combined Chinese Office Action and Search Report issued Feb. 15, 2023 in Patent Application No. 202210418399.X (with English language translation and English translation of Category of Cited Documents), citing documents 14-18 therein, 11 pages.

Notice of the Reason for Refusal issued Mar. 7, 2023 in Japanese Patent Application No. 2022-066037 (with English language translation), citing documents 19-22 therein, 13 pages.

European Search Report issued Sep. 29, 2021 in European Application 21169680.2 filed Apr. 21, 2021 (with English Translation of Categories of Cited Documents & Written Opinion), citing documents AA-AC, AO-AP & AX-AY therein, 9 pages.

Sodky et al., "Effect of Annealing on Properties of Decorative Zirconium Oxynitride Thin Films", The European Physical Journal Applied Physics, vol. 69, No. 3, Mar. 18, 2015, 7 Pages.

Chappe et al., "Influence of Air Oxidation on the Properties of Decorative NbOxNy Coatings Prepared by Reactive Gas Pulsing", Surface & Coatings Technology vol. 202, No. 11, 2008, 5 Pages.

Office Action issued Jul. 22, 2024, in corresponding Korean Patent Application No. 10-2022-0046954 (with English Translation), 11 pages.

* cited by examiner

METHOD FOR PRODUCING A CERAMIC WITH A MOTHER-OF-PEARL EFFECT, PARTICULARLY FOR WATCHMAKING

CROSS-REFERENCE TO RELATED APPLICATIONS

The present application claims the benefit of the filing date of European Appl. No. 21169680.2, filed on Apr. 21, 2021, the content of which is incorporated by reference.

TECHNICAL FIELD OF THE INVENTION

The invention relates to a method for producing a ceramic part with a mother-of-pearl effect, in particular for watchmaking.

TECHNICAL BACKGROUND

The invention will find an application in the manufacture of an external component intended, preferably but not exclusively, for the field of watchmaking. Preferably, such a component may for example be a watch bezel intended to be attached to a watch case, a bracelet link, a dial, a watch case, a clasp element.

The invention will also find an application in the manufacture of external components used in the fields, in a non-exhaustive manner, of mobile and cellular telephony, computer terminals, in particular portable ones, for example to form mobile phone or tablet shells, or else in the field of jewellery or tableware.

The invention relates in particular to elements made of hard materials, namely resistant to shocks and scratches. These hard materials may in particular be of technical ceramic types. Furthermore, each element can be made of zirconium dioxide or "zirconia", of aluminium dioxide or "alumina", or else of a composite material integrating a ceramic support and a metal matrix or "cermet". Each element of the external component of the invention can also be made of synthetic sapphire or ruby.

To manufacture these parts, use is made of a method comprising the following steps:
  producing a precursor from a mixture of at least one powdered material with a binder,
  forming a green body by injection into a mould or by pressing to give the shape of the final part to the green body,
  sintering said green body in order to harden it and obtain the desired part;

With conventional methods, the ceramic parts obtained can be coloured, for example white. There are methods to obtain a more or less shiny or rather matt ceramic colour.

However, the variation is limited to these shades of colours, and it is difficult to obtain other shades, so that interesting colour aspects for ceramics are missing.

SUMMARY OF THE INVENTION

The invention aims at overcoming the aforementioned disadvantages, and aims at providing a method for obtaining a ceramic part whose colour is pearly, that is to say which has iridescent reflections.

To this end, the invention relates to a method for producing a ceramic part with a mother-of-pearl effect, in particular for watchmaking.

The method is remarkable in that it comprises the following steps:
  a step of forming a ceramic body,
  a step of depositing a layer of an oxy-nitride component of the OxNy type on at least a portion of the ceramic body, and
  a step of oxidising at least a portion of the oxy-nitride layer, preferably by heating.

Thus, the method allows to obtain a mother-of-pearl colour on the surface of the ceramic. Indeed, the oxidation of the oxy-nitride layer on the surface of the portion of the ceramic part makes this layer partly transparent. The colour of the body is visible through this layer, which produces iridescent effects, and therefore a mother-of-pearl finish.

According to a particular embodiment of the invention, the method the step of forming the ceramic body comprises a sub-step of producing a precursor from a mixture of at least one powdered material with a binder.

According to a particular embodiment of the invention, the step of forming the ceramic body comprises a sub-step of forming a green body by injection into a mould or by pressing, the green body having the shape desired for the body.

According to a particular embodiment of the invention, the step of forming the ceramic body comprises a sub-step of sintering the green body in order to harden it and obtain the desired shape.

According to a particular embodiment of the invention, the body formed during the step of forming the body is made in one piece, and preferably made of white ceramic.

According to a particular embodiment of the invention, the method comprises a step of structuring the layer of the oxy-nitride component before the step of oxidising the layer.

According to a particular embodiment of the invention, the structuring step is carried out by photolithography, or by direct ablation, for example by laser.

According to a particular embodiment of the invention, the oxy-nitride component is to be selected from zirconia oxy-nitride of the $ZrO_xN_y$ type, Chromium oxy-nitride of the $CrO_xN$ type or Titanium oxy-nitride of the $TrO_xN_y$ type.

According to a particular embodiment of the invention, the body is heated to at least 500° C., preferably at least 600° C., during the oxidation step.

According to a particular embodiment of the invention, the step of depositing the oxy-nitride layer is carried out by physical vapour deposition of the PVD type.

According to a particular embodiment of the invention, the ceramic body formed during the step of forming the body comprises zirconia, preferably in its entirety.

According to a particular embodiment of the invention, comprises a step of polishing the body before the step of depositing the oxy-nitride layer.

BRIEF DESCRIPTION OF THE FIGURES

Other features and advantages will emerge clearly from the description given below, in an indicative and non-limiting manner, with reference to the appended drawings, wherein.

DETAILED DESCRIPTION OF THE INVENTION

Figure 1:
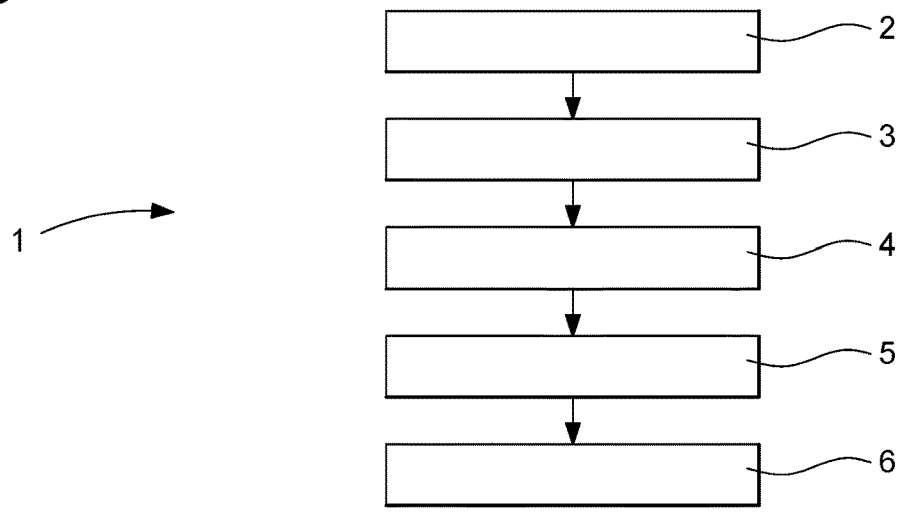
FIG. 1 is a block diagram representing the steps of the method according to the invention.

As explained above, the invention relates to a method for producing 1 a ceramic part with a mother-of-pearl effect, in particular for watchmaking, for example for a watch case, bracelet links, a watch bezel, or a dial including ceramic indices. This method 1 can of course be used for any ceramic part, apart from watchmaking.

The method 1 comprises a first step 2 of forming a ceramic body. In general, this step comprises several sub-steps. A first sub-step consists in producing a precursor from a mixture of at least one powdered material with a binder. This material is preferably ceramic. This step 2 is intended to form a precursor from a ceramic-based powder taken in the binder.

In this context, the ceramic-based powder may include at least one metal oxide, one metal nitride or one metal carbide. By way of example, the ceramic-based powder may include aluminium oxide or a mixture of aluminium oxide and chromium oxide, or else zirconium oxide. In addition, the binder can be of various natures such as, for example, polymeric types or organic types.

The first step 2 then includes a sub-step of forming the green body, wherein the green body is given a shape corresponding to the final part that is to be obtained. To this end, a method for moulding by injecting the precursor into a mould is preferably used. Alternatively, a method for pressing the precursor can be used with a pressing device provided with an upper die and a lower die between which the precursor is pressed.

The first step 2 includes a third sub-step of sintering the green body in order to form a hard body in the ceramic material. Preferably, the sintering sub-step may include pyrolysis. During the sintering step, the body shrinks by a coefficient depending on the material it is made of.

The ceramic body obtained is preferably made in one piece, and comprises for example zirconia, preferably in its entirety.

In a second step 3, the sintered body is polished to give it a smooth surface facilitating the deposition of the third step, and allows to have an advantageous aesthetic appearance for the portions of the ceramic body which will remain visible for the final part.

The third step 4 of the method 1 consists in depositing a layer of an oxy-nitride compound of the OxNy type on at least a portion of the ceramic body. The oxy-nitride compound is preferably to be selected from zirconia oxy-nitride of the ZrOxNy type, chromium oxy-nitride of the CrOxN type or titanium oxy-nitride of the TrOxNy type. The layer preferably has a thickness comprised between 50 and 1000 nm, or even between 100 and 500 nm.

The deposition of the oxy-nitride layer is preferably carried out by physical vapour deposition of the PVD type. For example, a reactive spray deposition method is used.

Optionally, the method 1 comprises a fourth step 5 of structuring the layer of the oxy-nitride compound. This step is used if it is desired to have a particular mother-of-pearl pattern. Structuring consists in giving a shape to the oxy-nitride layer by removing some portions of the layer. It is for example possible to choose a pattern corresponding to a Logo, a brand or time indices drawn on glasses.

This structuring step 5 is preferably carried out by photolithography. Photolithography consists in depositing a layer of photosensitive resin on the portions of the layer to be preserved to protect them and chemically etching the oxy-nitride layer to remove the portions which are not protected by the resin. Thus, only a portion of the layer is kept after the protective resin has disappeared.

Alternatively, the structuring can be carried out by means of a laser, which removes portions of the oxy-nitride layer.

In a fifth step 6, the oxy-nitride layer is oxidised to give it a mother-of-pearl or iridescent appearance. For this purpose, the part is heated, preferably in an oven. The part is heated to at least 500° C., preferably at least 600° C. The heating oxidises the layer or the portions of the oxy-nitride layer, and makes them at least partly transparent. This partly transparent layer gives the mother-of-pearl or iridescent effect.

FIGS. 2 to 7 show illustrations of the different steps of producing a part according to the method described above, in particular for the steps of structuring the oxy-nitride layer.

Figure 2:
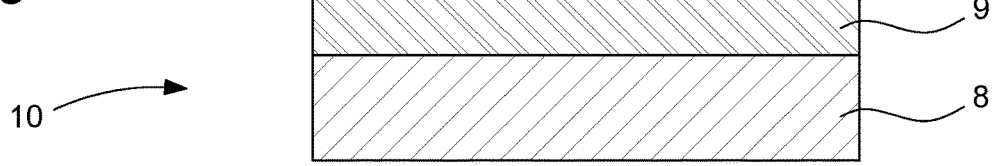
FIG. 2 is a schematic representation of a sectional view of a body on which an oxy-nitride layer has been deposited.

In FIG. 2, a body 8 formed according to the first and the second step of the method is covered with an oxy-nitride layer 9, according to the third step of the method by a PVD type method.

To structure the layer 9 and select a portion to keep, photolithography is carried out, wherein a photosensitive resin 11 is applied over the entire layer 9. A mask is disposed on the resin 11 to protect a portion of the resin 11. The mask has the shape that is to be obtained for the layer, which is either positive or negative, depending on the resin used.

Figure 3:
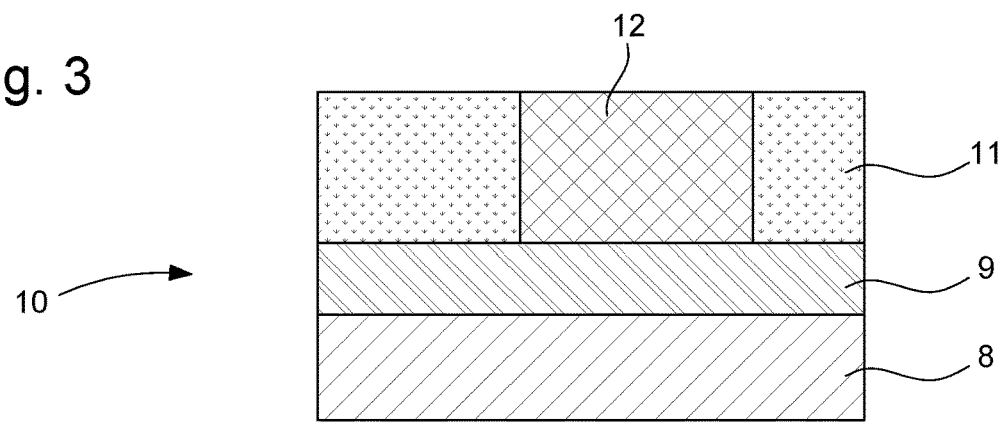
FIGS. 3 to 6 are schematic representations of sectional views of the body of FIG. 2 during the sub-steps of structuring the oxy-nitride layer.

The assembly is subjected to radiation, preferably ultraviolet, to modify the features of the illuminated resin. Two resin portions 11, 12 are thus obtained, as shown in FIG. 3, one of them having been exposed to radiation, the other portion not having been subjected to radiation.

Alternatively, it is possible to avoid the use of a mask, and directly expose the resin 11 with a selective ultraviolet source, such as an ultraviolet laser.

Figure 4:
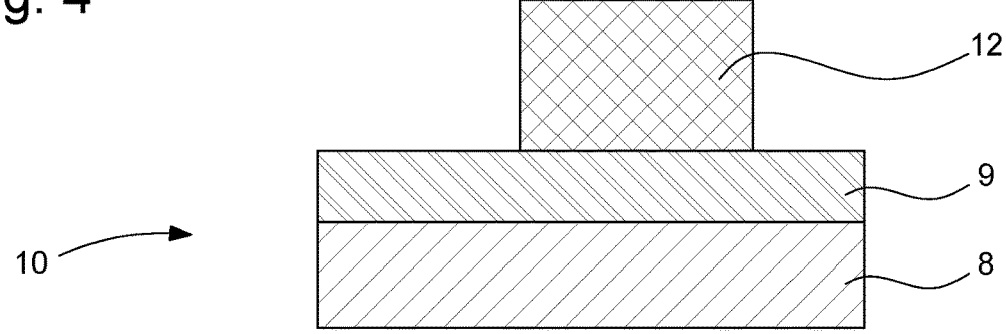

One of the resin portions 11 is eliminated, to keep only a resin portion 12 on a portion of the oxy-nitride layer, as shown in FIG. 4.

Figure 5:
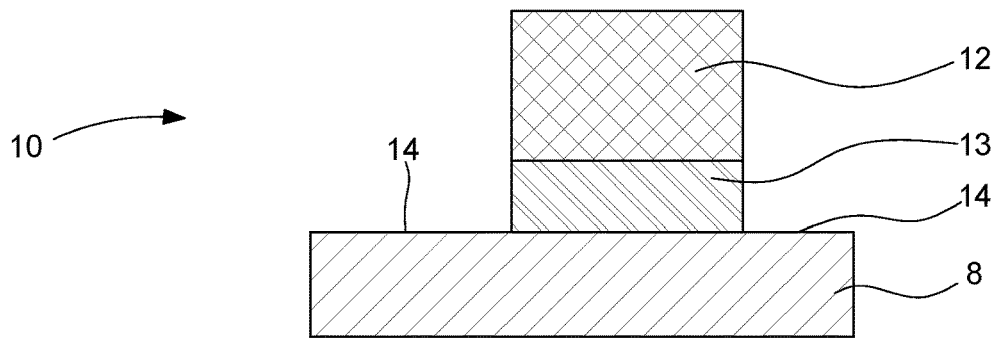
Figure 6:
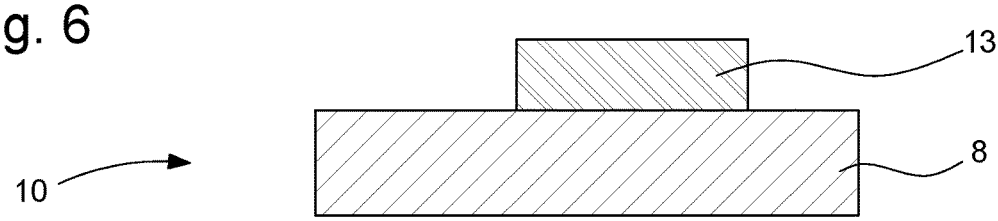
Figure 7:
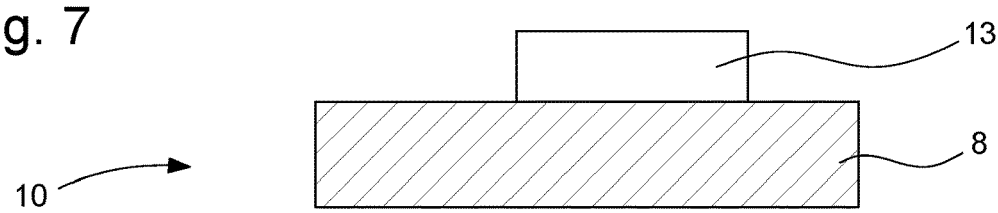
FIG. 7 is a schematic representation of a sectional view of the body obtained after the oxidation step.

In FIG. 5, the portion of the oxy-nitride layer 14 which is not protected by the remaining resin portion 12 is removed by a chemical etching sub-step. Thus, it is possible to obtain the body 8 partially covered by a portion of the oxy-nitride layer 13 and the remaining resin portion 12.

The resin portion 12, which allowed to protect the portion of the selected layer, is then eliminated to keep only the body and said portion.

According to the fifth step of the method, the portion of the oxy-nitride layer 13 is oxidised by heating it, according to the fifth step of the method, in order to make it at least partially transparent. Thus, a ceramic body 8 partly covered by a transparent layer 13 producing an iridescent or mother-of-pearl effect is obtained.

Figure 8:
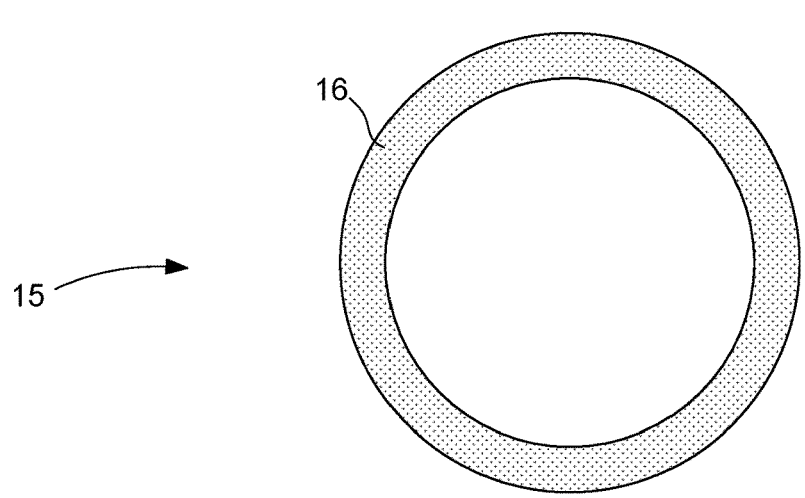
FIG. 8 is an example of a part obtained using the method according to the invention.

FIG. 8 is an example of part 15 in the shape of a ceramic ring for a watch bezel. In this case, the ring is almost completely covered with an iridescent layer 16. The method described above was used, the step of structuring the oxy-nitride layer serving for example to inscribe a logo on the ring.

A part can be completely covered with an iridescent layer, the structuring step not being applied in this case.

Of course, the present invention is not limited to the example illustrated but is susceptible to various variants and modifications which will become apparent to the person skilled in the art.

The invention claimed is:

1. A method for producing a ceramic part with a mother-of-pearl effect, the method comprising:
   forming a ceramic body;
   depositing an oxy-nitride layer comprising an oxy-nitride component on at least a portion of the ceramic body; and
   oxidizing at least a portion of the oxy-nitride layer,
   wherein the ceramic body is heated to at least 600° C. during the oxidizing, and
   wherein a mother-of-pearl effect is obtained on a surface of the ceramic body after the oxidizing.

2. The method of claim 1, wherein the forming comprises producing a precursor from a mixture comprising a powdered material and a binder.

3. The method of claim 2, wherein the forming comprises forming a green body with a sub-step of sintering the green body in order to harden it and obtain a desired shape.

4. The method of claim 1, wherein the ceramic body formed during the forming is made in one piece.

5. The method of claim 1, further comprising:
   structuring the oxy-nitride layer before the oxidizing.

6. The method of claim 5, wherein the structuring comprises photolithography.

7. The method of claim 1, wherein the oxy-nitride component comprises zirconia oxy-nitride, chromium oxy-nitride, or titanium oxy-nitride.

8. The method of claim 1, wherein the depositing the oxy-nitride layer comprises PVD physical vapor deposition.

9. The method of claim 1, wherein the ceramic body formed during the forming comprises zirconia.

10. The method of claim 1, further comprising:
    polishing the ceramic body before the depositing of the oxy-nitride layer.

11. The method of claim 1, which is a method for watchmaking.

12. The method of claim 1, wherein the oxidizing comprises heating.

13. The method of claim 2, wherein the forming comprises forming a green body by injection into a mold, the green body having a shape desired for the body.

14. The method of claim 2, wherein the forming comprises forming a green body by pressing, the green body having a shape desired for the body.

15. The method of claim 1, wherein the body formed during the forming is made in one piece of white ceramic.

16. The method of claim 5, wherein the structuring comprises direct ablation, by laser.

17. The method of claim 1, wherein the oxy-nitride component is not zirconia oxy-nitride.

* * * * *